United States Patent [19]

Schochat et al.

[11] 4,188,529
[45] Feb. 12, 1980

[54] ELECTRONIC CB TWENTY METER

[76] Inventors: Nathaniel E. Schochat, 620 Forest Hill Rd., Macon, Ga. 31210; Fred L. Martin, 8101 Elderberry Dr., Knoxville, Tenn. 37919

[21] Appl. No.: 897,542

[22] Filed: Apr. 18, 1978

[51] Int. Cl.² .................. H03K 21/36; G06F 15/20
[52] U.S. Cl. .................. 235/92 DN; 235/92 PL; 235/92 PE
[58] Field of Search ........ 235/92 DN, 92 PE, 92 PL, 235/95 R, 97; 364/424, 561, 460, 449

[56] References Cited

U.S. PATENT DOCUMENTS

| | | | |
|---|---|---|---|
| 3,601,585 | 8/1971 | Paulsen | 235/92 DN |
| 3,614,617 | 10/1971 | Blake | 235/92 DN |
| 3,845,281 | 10/1974 | Konisi et al. | 235/92 PL |
| 3,865,305 | 2/1975 | Sampey | 235/92 DM |
| 3,947,664 | 3/1976 | Cox et al. | 235/92 DN |
| 4,068,307 | 1/1978 | Floyd et al. | 364/460 |
| 4,103,332 | 7/1978 | Floyd et al. | 364/424 |

Primary Examiner—Joseph M. Thesz
Attorney, Agent, or Firm—Mitchell B. Wasson; Martin P. Hoffman

[57] ABSTRACT

A mile post and mileage indicator for maintaining the exact mile post position of a vehicle while said vehicle is travelling upon a roadway containing designated mile post signs, which increase or decrease in a particular direction. This indicator may also be used to indicate exactly how far the vehicle has travelled or how much further it must travel before it reaches a certain destination. The indicator contains electronic circuits for presetting a specific mileage onto a display and for increasing or decreasing the mileage display in conjunction with a pulser unit placed in the speedometer cable of the vehicle. A calibration unit is utilized which corrects minor errors in signals received from the vehicle transmission.

3 Claims, 6 Drawing Figures

PRESET TIMING DIAGRAMS

MOSTEK DIGIT SELECT OUTPUTS

CALIBRATION TIMING DIAGRAMS

ELECTRONIC CB TWENTY METER

FIELD OF THE INVENTION

The present invention relates to indicating meters or other devices for keeping a running total of a distance similar to an odometer, or for indicating precisely the exact mileage position of a vehicle with respect to external mile post markers.

BACKGROUND OF THE INVENTION

Most trucks on the road today contain a CB unit and a rapidly increasing number of passenger vehicles also contain a CB transceiver. These units are used to obtain such information as road conditions, the weather, or are used as a means for conversation. Almost every citizen's band conversation contains a request for the user's location, or, in CB parlance, their "10-20". Most major highways contain mile post indicators appearing on the right shoulder of the road. These indicators denote the distance between the traveller's present location and an arbitrary point, such as the terminus of the highway or a state boundary. These indicators are positioned every mile or tenth of a mile and usually increase when travelling from south to north and west to east and decreases when travelling from north to south and east to west.

Therefore, while travelling these major highways, the location request or "10-20" usually indicates that the mile post position of the driver is desired. Heretofore, a driver would either have to wait until the next mile post marker is passed or would simply have to approximate the location. At the present time, there is no indicator available which would readily allow the CB user, or any other driver, to quickly, simply and easily determine his or her exact location on a major highway.

SUMMARY OF THE INVENTION

The present invention relates to a location indicator which may be used to indicate, at a glance, the exact location of the driver with relation to the aforementioned mile post indicators or any other point of interest. Consequently, this device may also be utilized to indicate exactly how far the driver has proceeded from the beginning of his trip, or how much further he must travel before he reaches his destination.

The device of the present invention is placed in line with the speedometer cable of the vehicle and contains electronic circuitry which updates an electronic counter for updating the distance the vehicle has travelled. Circuitry is included which would either increase or decrease information displayed on a display screen. Through the use of a preset circuit, the exact mileage of the vehicle when it entered the highway is inputted into the device. Additionally, although the information preset into the counter does not include tenths of a mile, the tenths of a mile display is automatically zeroed upon actuation of any preset switch.

Electronic circuitry can be implemented to allow presetting of the unit when it is actively operating. A hold mode is included in the device whereby input pulses are not accumulated, but the information displayed immediately proceeding the initiating of the hold mode is retained on the display. The unit also includes an up/down switch for either automatically increasing or decreasing the display information and a power switch for supplying a zero mileage display value when the unit is activated. A calibration feature is included for correcting minor errors in the signals received from the vehicle transmission.

The drawings furnished herewith illustrate a preferred construction of the present invention in which the above advantages and features are clearly disclosed as well as others will be clear from the following description.

DETAILED DESCRIPTION OF THE PREFERRED EMBODIMENT

Figure 1:
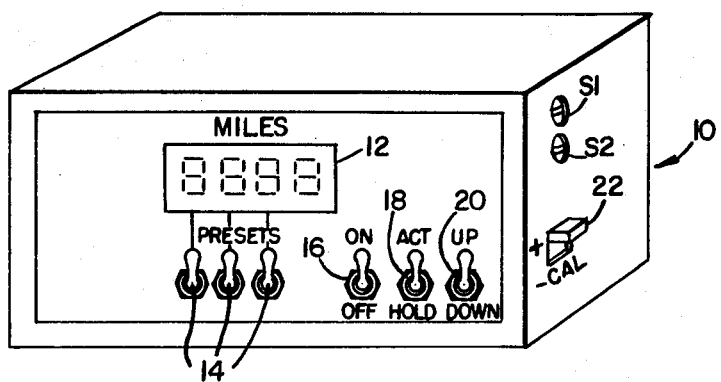
FIG. 1 is a perspective view of the indicator unit.

As shown in FIG. 1, the indicator mechanism 10 contains a display unit 12 which displays the driver's location with respect to the mile post indicators contained on most major thoroughfares. As depicted herein, the display unit 12 displays hundreds, tens, units and tenths. However, the exact number of digits displayed is not crucial and the number can easily be changed by utilizing different counter and display units. Preset switches 14 are used to input a specific value to be displayed on the display unit 12. This number would most likely correspond to the mile post indicators and would be used as the base figure which is increased or decreased in a manner described fully hereinbelow.

The unit 10 is operated from a DC power supply such as the vehicle's battery itself or any other small battery producing a potential of approximately 12 volts. A power switch 16 is used to activate the unit. Switch 18 allows the unit to be either in an active mode or a hold mode. While in the active mode, the counter increments or decrements the display unit allowing the driver to be aware of his exact location. The hold mode merely "freezes" the information shown in the display unit so that the input pulses are not accumulated by the electronic counter contained in the indicator unit. Switch 20 allows the unit to either increment or decrement the display unit depending upon whether the mile post indicators are increasing or decreasing. Calibration switch 22 is used to adjust for minor discrepancies in the counting network or the signals transmitted to the indicator mechanism indicating how far the vehicle has travelled.

Figure 2A:
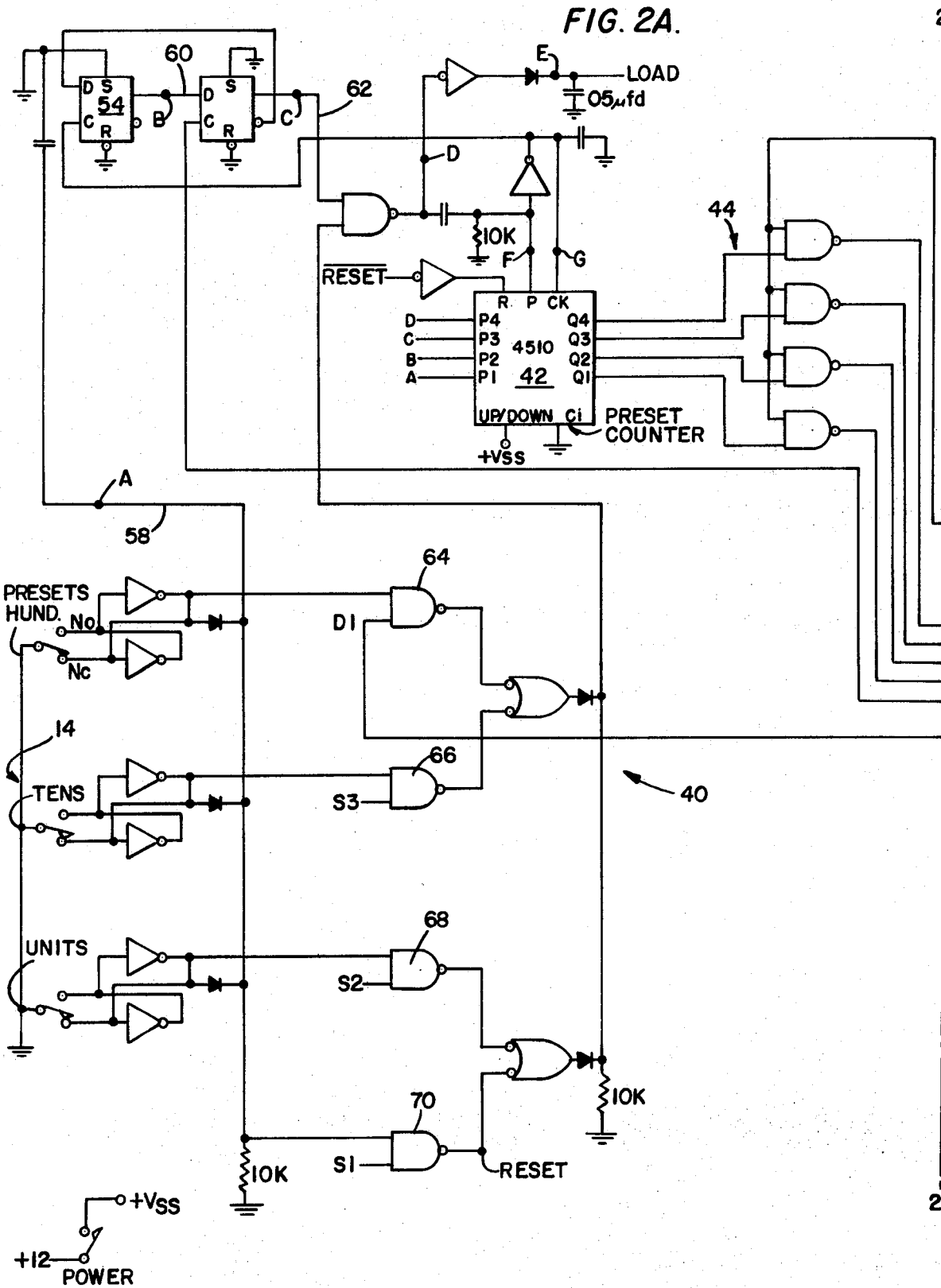
FIGS. 2A and 2B are schematic drawings of the electronic circuitry utilized by the indicator unit.
Figure 2B:
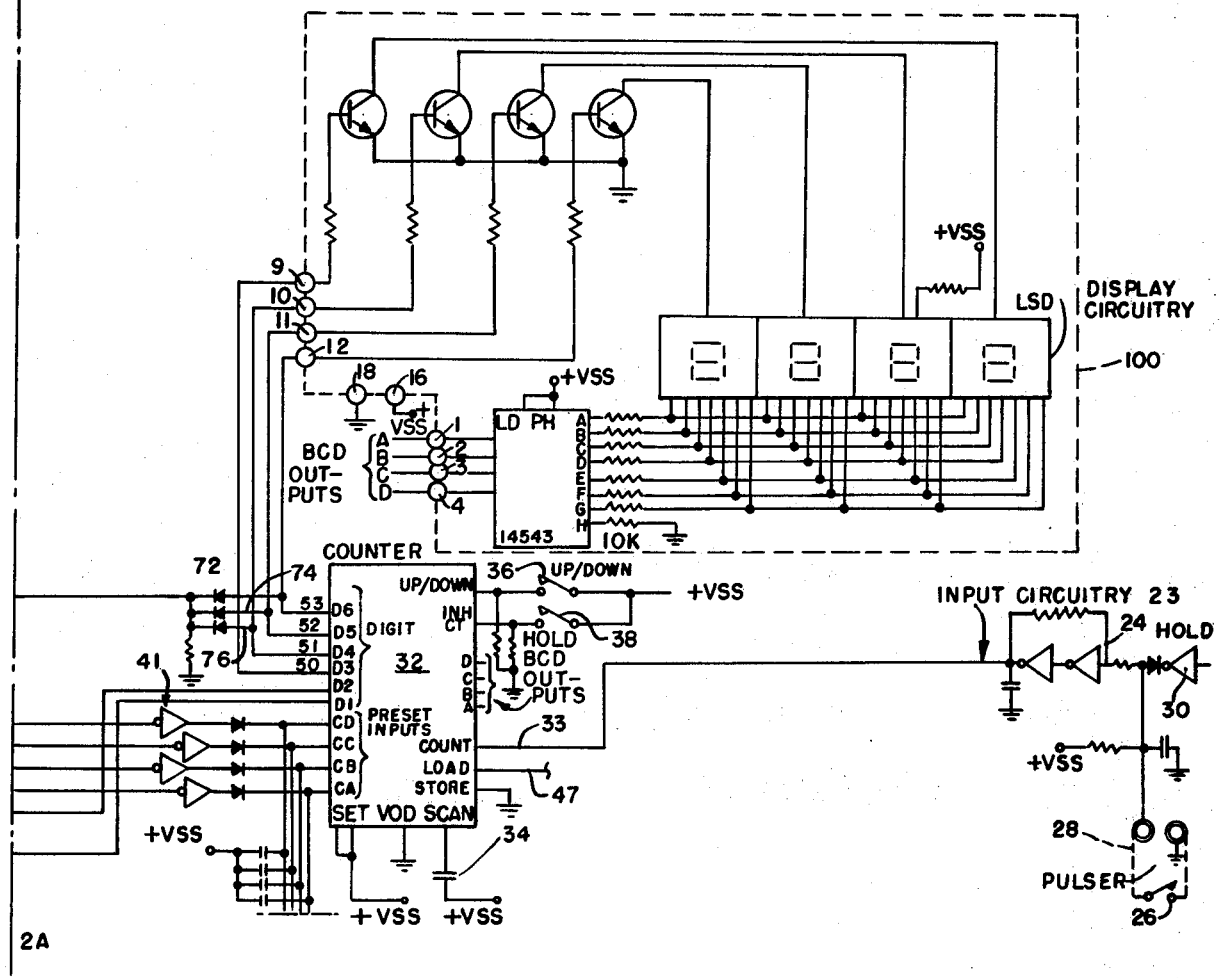

The electronic circuitry utilized by the electronic Twenty Meter is shown in FIGS. 2A and 2B. Indexing signal pulses are produced by input circuitry 23. This circuit contains a pulser unit 28 including a rotational transducer 26 placed in the speedometer cable of the vehicle. The contact closure of the transducer 26 opens and closes 1,000 times during each mile that the vehicle travels. Therefore, after 100 pulses, the tenths digit of a display unit is either increased or decreased by one unit. This change in the display is accomplished by applying the pulses produced by the input circuitry 23 to a counter 32 such as a MOSTEK MK50399. The input circuitry consists basically of a Schmitt trigger 24 with a lock-out feature. The trigger is actuated when the indicator is in the active mode. The hold switch 18 activates an inverter 30 which prevents input pulses from being transmitted to the counter 32 and therefore does not allow the display unit to be updated.

The counter 32 could be a MOSTEK counter such as MK50399 although other variaties of counters could of course be employed. This particular counter is a six-decade counter with multiplexed BCD inputs and outputs with digit strobes. It utilizes its own scan circuitry, however, an external capacitor 34 should be used. These digit strobes $D_1$, $D_2$, $D_3$, $D_4$, $D_5$ and $D_6$, or timing signals, provide the synchronizing signals required to enter, process and display a particular count. Since only four digits are produced on the display unit, only strobes $D_3$, $D_4$, $D_5$ and $D_6$ are connected to the display. Strobes $D_1$ and $D_2$ are used in the internal count.

The digit strobe corresponding to a particular digit is mutually exclusively high as long as the BCD output for that digit is valid. The counter includes a control input activated by the up/down switch 20 present on the front panel of the device. Switch 20 operates closure 36 and whenever the signal inputted to the counter, based upon activating up/down switch 20, is high, the counter is counting in the up mode. However, whenever this signal is low, the counter is operating in the down mode.

An inhibit input count is operated by the active/hold switch 18 through closure device 38. When this particular input is high (hold mode), no count input pulses are "seen" at the counter and thus not accumulated. Therefore, the active/hold switch 18 directly controls the inhibiting of pulses to Schmitt trigger 24 in the input circuitry in addition to the counter 32.

The four binary coded decimal output (BCD) lines (A, B, C, D) outputted from the counter 32 are sent to the display circuitry 100 and to a preset counter 42 included within preset circuitry 40. When sent to the display circuitry 100, the signals are decoded and sent to the appropriate displays and are therefore indicative of the number or digit counts stored in counter 32. Briefly, when sent to the preset counter 42, the BCD signals allow the preset circuitry to increment the particular display value. If a preset order is received, the BCD signals in the preset counter 42 corresponding to the digit you are presetting is incremented in preset counter 42 and then reloaded into counter 32 by preset inputs $Q_1$, $Q_2$, $Q_3$ and $Q_4$ which are also BCD. This information is transferred to counter 32 by NAND gate, inverter combination 44. The preset circuitry will be explained in greater detail hereinbelow.

The calibration circuit 46 allows the counter to calibrate due to different tire radii and tread design which will slightly alter the 1,000 pulse/mile pulser input. This circuit is controlled by switches 22, S1 and S2, located on the side of the CB Twenty Meter unit. These switches control BCD switches 48 and 50 which allow calibration in either a positive or negative direction and that the number of pulses received by the counter 32 are altered.

In operation, switch 22 is switched into the + or − mode thereby controlling the direction of calibration. As indicated previously, pulser 28 should pulse 100 times before the tenths unit is incremented or decremented. Therefore, after the counter 32 has received 100 pulses, the vehicle should have travelled one tenth of a mile. However, if the vehicle travels more than a tenth of a mile for every 100 pulses of pulser 28, the display reading will become inaccurate. In this situation, the switch 22 is placed in the positive mode and the counter 32 is presented a certain amount of extra pulses supplied by the calibration circuit. In other words, if the pulser 28 only pulses 90 times for each tenth of a mile traversed by the vehicle, then after every tenth of a mile increment, the input signal to counter 32 will have 10 extra pulses. Similarly, if the vehicle requires more than 100 pulses to travel a tenth of a mile, not all of these pulses would be presented to the counter 32, and the counter would still increment when it reaches count 100.

The calibration circuitry provides a plus or minus ten percent adjustment range with a resolution of 0.1 percent. To accomplish this, the calibration circuitry multiplies the pulser input frequency by ten. The calibration circuitry then adds (Cal = +) or subtracts (Cal = −) the number of pulses set in switches S1 and S2 and finally divides the resulting frequency by ten. This operation occurs each time the calibration circuitry receives a multiple of 100 pulses from the pulser.

Figure 5:
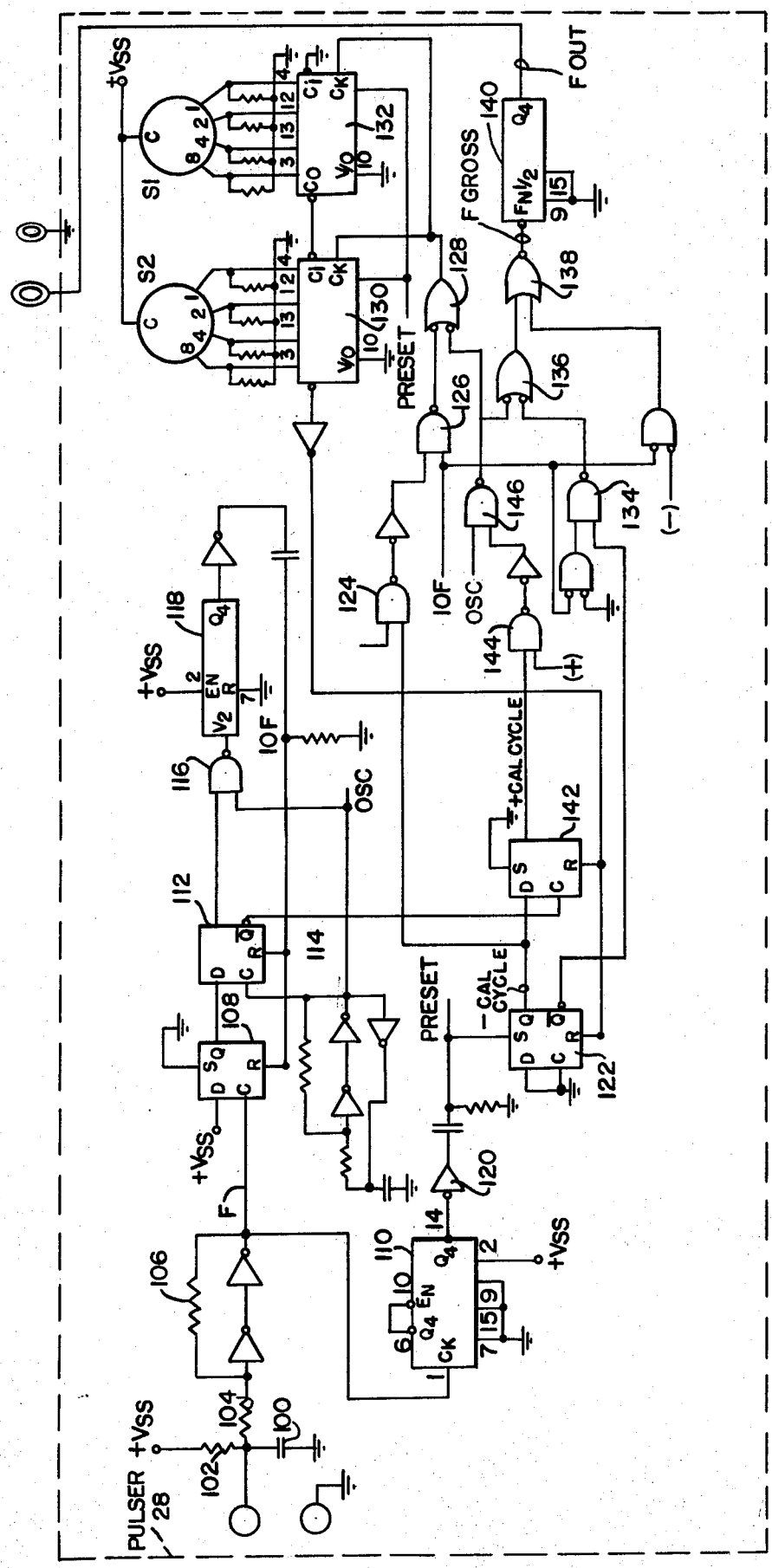
FIG. 5 is a schematic drawing of the calibration circuitry.

As shown in FIG. 5, the closure of the contracts of pulser 28 produces a signal which is filtered by an R-C circuit comprising capacitor 100 and resistors 102. This signal is then conditioned by Schmitt trigger circuit 106 and the resulting signal is inputted to flip flop 108 and a counter 110. Flip-flop 108 is connected to a flip-flop 112 so that the signal produced by Schmitt trigger 106 is synchronized with the output of oscillator circuit 114. When flip-flop 112 is enabled, the signal produced by oscillator 114 is gated through NAND gate 116 to counter 118 which divides the produced signals by ten. After NAND gate 116 produces ten pulses, flip-flops 108 and 112 are disenabled and gate 116 prevents the passage of the pulses produced by oscillator circuit 114.

Counter 110 divides the signal produced by the Schmitt trigger 106 by 100 and fires a one-shot 120 and enables the (−) calibration cycle flip-flop 122. Since there are 100 input pulses per tenth of a mile, flip-flop 122 is enabled every tenth of a mile.

During the (−) calibration cycle, the output of NAND gate 124 will be low and NAND gate 126 will be enabled. 10F pulses will pass through NOR gate 128 into counters 130 and 132. The (−) calibration cycle will remain on until the number of pulses shown in S1 and S2 have been counted by counters 130 and 132, respectively.

It should be noted that counters 130 and 132 are preset to the value shown in S1 and S2 at the same time the (−) calibration cycle was initiated by the preset signal. As counters 130 and 132 are being counted down, the pulses from 10F are not allowed to pass through NAND gate 134 to NOR gates 136 and 138 and counter 140 and out to the main circuitry, which in essence means that these pulses were subtracted. If S1 and S2 are set to zero, all of the pulses from 10F would be passed through gates 132, 136 and 138 and then divided by ten by counter 140. The result of this operation would be that for every input pulse, there would be one and only one output pulse and there would be no scaling. Increasing the values in S1 and S2 would lead to increased scaling.

During the (+) calibration cycle, flip-flop 142 would be enabled. This results in NAND gate 144 causing NAND gate 146 to be enabled, and allows gate 146 to conduct oscillator pulses through NOR gate 128 to counters 130 and 132. The (+) calibration cycle remains on until counters 130 and 132 divide the oscillator pulses by the value set in S1 and S2. As before, counters 130 and 132 are preset at the beginning of the calibration cycle to the value set in S1 and S2 by the preset signal.

Figure 4:
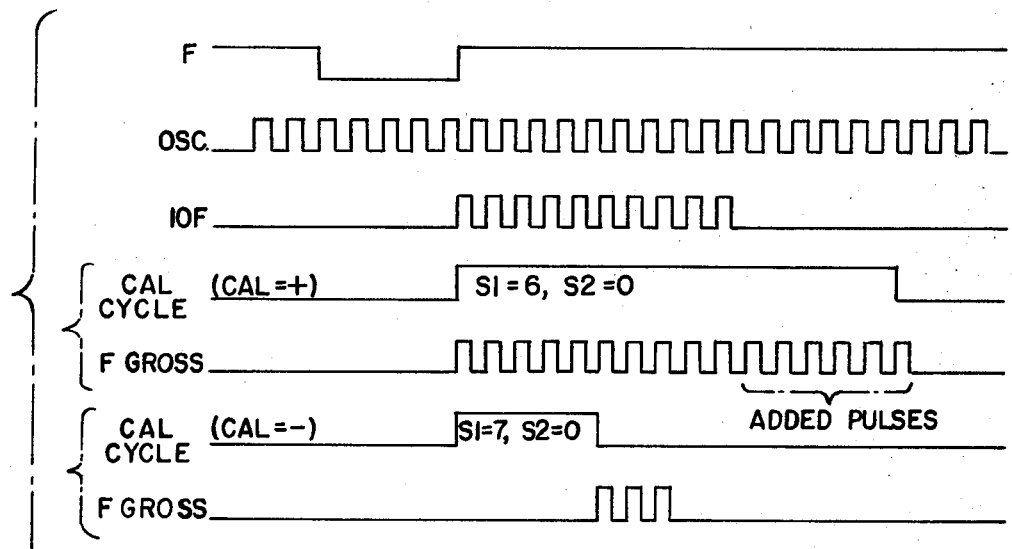
FIG. 4 is a timing diagram showing the timing of the calibration circuitry.

During the (+) calibration cycle, as counters 130 and 132 are counting down, the oscillation signals are passing through gates 136 and 138 to counter 140. As previously described, counter 140 divides the signals by ten before sending them to the main circuitry. The pulses set into S1 and S2 are being added to the 10F pulses during each calibration cycle. As before, no scaling occurs if S1 and S2 are zero. The timing diagrams for this circuit is shown in FIG. 4.

As shown in FIG. 1, the correction value is inputted into the calibration circuitry by means of screwdriver switch adjusters. However, an alternative construction would be to eliminate the switch adjuster and mode switch 22 and include a simple vernier adjuster utilizing a potentiometer in conjunction with a frequency multiplier and duty cycle in the input count line 33 of the counter 32.

The present circuit 52 allows independent presetting for the hundreds, tens and units digits of the display 100. The circuit would present any digit into the display when the power switch 16 is activated regardless of the mode of the active/hold switch 18. The preset circuitry is actuated by switches 14 corresponding to the hundreds, tens and units digits. Also included is a present request flip flop 54, a preset cycle flip flop 56 and a preset counter 42.

Figure 3:
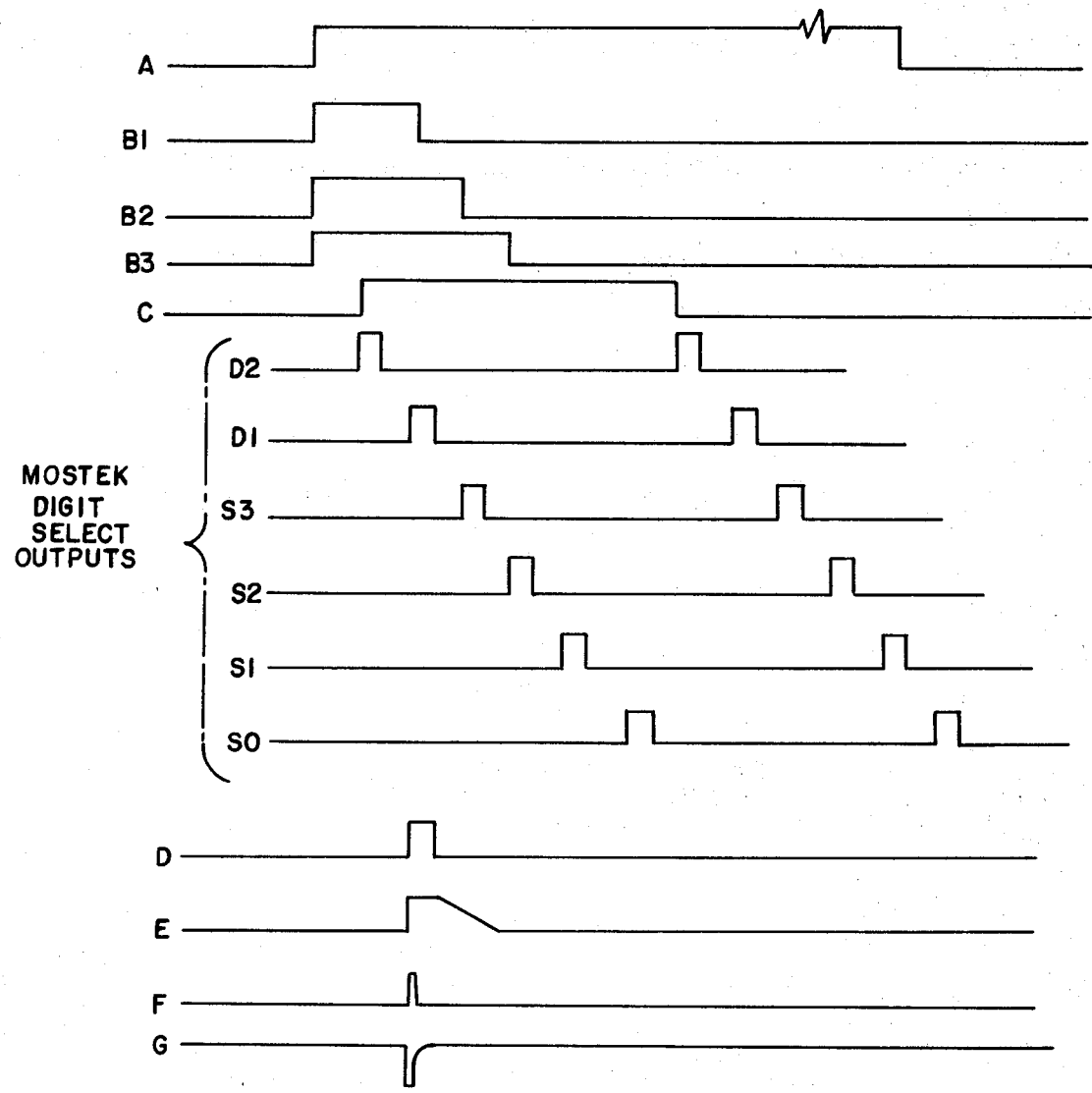
FIG. 3 is a timing diagram showing the timing of the present circuitry.

The preset circuit operates in the following manner controlled by the input call load of counter 32, as shown in conjunction with the timing diagram of FIG. 3. This input is actuated precisely at the correct time for a digit from the preset circuitry such that the preset inputs are valid at that time, and that the load is activated for an appropriate amount of time to cause that digit to be updated. When one of the preset switches is depressed, a signal is produced in line 58 (line A of diagram) and is transmitted to preset request flip flop 54 and then to preset cycle flip flop 56 through line 60. This is depicted on the timing diagram as lines B1, B2 and B3 representing the hundreds switch, the tens switch and the ones switch respectively. A preset cycle has thus been included at point C in line 62 and is needed since the preset cycle must be synchronized to allow the preset counter to be both preset and incremented at the appropriate time. This synchronization is a function of two variables. The first variable is that the preset cycle flip flop signal C must be high and the second variable is a signal gated from any of the NAND gates 64, 66, 68 and 70 of the corresponding switch with a previous indexing of the counter 32. This is necessary to allow a set-up time so that counter 32 could be preset properly through the load signal line 47. This is a characteristic of the MOSTEK chip itself, and before you can properly preset a digit into it, the load signal 47 must have been low for at least two microseconds prior to the preset request (line E), whereby the trailing edge of the signal delays the counter 32 until the proper time. This is true regardless if the switches 14 is being preset. The present counter accepts the BCD output from the MOSTEK counter 32 (line F), increments it (trailing edge of line E) and loads it back into the counter 32 at the appropriate time. The trailing edge of line G allows the preset counter to increment.

As shown in FIGS. 1 and 2A, only the hundreds, tens and units digits are preset. In order to automatically zero the least significant tenths digit, diodes 72, 74, 76 connected to output lines D6, D5 and D4 respectively are provided. A signal is developed which is the OR of these signals and if the preset cycle is developed, these digits will be reset. However, since the tenths output signal has no diode, it cannot be reset and the input data signal loaded from the preset counter 42 to the MOSTEK counter 32 will contain a zero for the tenths digit. The preset mechanisms and timings would operate precisely in the same manner regardless of whether the indicator is operating in the active or hold mode.

This display circuitry 100 receives the BCD output from the MOSTEK counter 32 indicative of the number of digit counts stored in said counter. The display circuitry includes a digital read-out display showing the hundreds, tens, units and tenths digits. Each of these displays comprises an LED seven segment display, each of the seven LED segments being connected to a separate terminal.

The electronic device operates in the following manner. When the driver enters a highway containing mile post markers, the mile post indicator is preset by activating switches 14 after the power switch 16 has been actuated. The driver then determines if the mile post indicators are increasing or decreasing and sets the up/down counter 20 accordingly. Therefore, when switch 18 is in the active mode, the electronic counter would index in either an increasing or decreasing manner.

As will be apparent to persons skilled in the art, various modifications, adaptions and variations of the foregoing specific disclosure can be made without departing from the teachings of the present invention.

We claim:

1. An electronic indicator for maintaining the exact mile post position of a vehicle in relation to mile post indicators comprising:

(a) pulse means for generating a pulse based upon the distance travelled by the vehicle;

(b) electronic counter means connected to said pulser means for counting the pulses generated by said pulser means and converting said pulses to BCD outputs;

(c) display means connected to said electronic counter means for displaying the count present in said counter as a mileage position indicator; and (d) calibration means connected between said pulser means and said electronic counter means, said calibration means operating in either a positive or negative mode and including pulse inhibiting means for preventing a number of the pulses generated by said pulser means to be presented to said electronic counter means when the calibration means is operating in its negative mode and pulse generating means for presenting additional pulses to said electronic counter means when said calibration means is operating in its positive mode.

2. An electronic indicator in accordance with claim 1 further including:

preset means connected to said electronic counter means for presetting a count in said electronic counter.

3. An electronic indicator in accordance with claim 1 or 2 further including:

hold means connected between said electronic counter and said pulser means for maintaining a display in said display means.

* * * * *